(12) United States Patent
Li

(10) Patent No.: US 11,846,858 B2
(45) Date of Patent: Dec. 19, 2023

(54) ARRAY SUBSTRATE AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Wei Li, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 156 days.

(21) Appl. No.: 17/600,541

(22) PCT Filed: Jul. 23, 2021

(86) PCT No.: PCT/CN2021/108179
§ 371 (c)(1),
(2) Date: Sep. 30, 2021

(87) PCT Pub. No.: WO2022/267157
PCT Pub. Date: Dec. 29, 2022

(65) Prior Publication Data
US 2023/0213826 A1    Jul. 6, 2023

(30) Foreign Application Priority Data

Jun. 21, 2021 (CN) .......................... 202110684388.1

(51) Int. Cl.
*G02F 1/1362* (2006.01)
*G02F 1/1368* (2006.01)
*H01L 27/12* (2006.01)

(52) U.S. Cl.
CPC ...... *G02F 1/136286* (2013.01); *G02F 1/1368* (2013.01); *H01L 27/124* (2013.01)

(58) Field of Classification Search
CPC ..................................................... G02F 1/1362
See application file for complete search history.

(56) References Cited

U.S. PATENT DOCUMENTS

| 5,151,806 A | 9/1992 | Kawamoto et al. |
| 2016/0246086 A1* | 8/2016 | Woo .................. G02F 1/136213 |

FOREIGN PATENT DOCUMENTS

| CN | 104865763 A | 8/2015 |
| CN | 105470269 A | 4/2016 |
| CN | 105911776 A | 8/2016 |

(Continued)

*Primary Examiner* — Sang V Nguyen
(74) *Attorney, Agent, or Firm* — The Roy Gross Law Firm, LLC; Roy Gross

(57) ABSTRACT

An array substrate and a display panel are provided. The array substrate includes a base substrate, a first metal layer disposed on the base substrate, a first insulating layer disposed on the first metal layer, a second metal layer disposed on the first insulating layer, a second insulating layer disposed on the second metal layer, and a pixel electrode layer disposed on the second insulating layer. The array substrate further includes common wirings and voltage-dividing wirings. An orthographic projection of the common wirings on the base substrate does not overlap with an orthographic projection of the voltage-dividing wirings on the base substrate.

20 Claims, 4 Drawing Sheets

(56) References Cited

FOREIGN PATENT DOCUMENTS

| CN | 107490912 | A |   | 12/2017 |   |           |
|----|-----------|---|---|---------|---|-----------|
| CN | 110120395 | A |   | 8/2019  |   |           |
| CN | 110491881 | A |   | 11/2019 |   |           |
| CN | 111103732 | A |   | 5/2020  |   |           |
| CN | 111308802 | A |   | 6/2020  |   |           |
| CN | 112363354 |   | * | 2/2021  | … | G02F 1/1362 |
| CN | 112363354 | A |   | 2/2021  |   |           |
| CN | 112563290 | A |   | 3/2021  |   |           |

\* cited by examiner

ARRAY SUBSTRATE AND DISPLAY PANEL

CROSS REFERENCE TO RELATED APPLICATIONS

This application is a National Phase of PCT Patent Application No. PCT/CN2021/108179 having International filing date of Jul. 23, 2021, which claims priority to China Patent Application No. 202110684388.1, filed on Jun. 21, 2021, titled "ARRAY SUBSTRATE AND DISPLAY PANEL." The contents of the above applications are incorporated herein by reference in their entirety.

BACKGROUND OF INVENTION

1. Field of Invention

The present application relates to a technical field of displays, and more particularly, to an array substrate and a display panel.

2. Related Art

Liquid crystal display is one of the most widely used display methods in a technical field of displays today. Liquid crystal display panels are composed of array substrates, opposing substrates, and liquid crystals located between the array substrates and the opposing substrates. An electric field provided by pixel electrodes on the array substrates is a power source for a deflection of liquid crystal molecules. In order to make the liquid crystal display panels have greater viewing angles, a pixel electrode in each pixel will have to be divided into a main electrode and an auxiliary electrode, and the main electrode is connected to a voltage-dividing wiring to reduce an electric field intensity generated by the main electrode. Under an effect of different electric field intensities of the main electrode and the auxiliary electrode, liquid crystal molecules in a same pixel are deflected at different angles, thereby improving viewing angles of the display panels. However, the voltage-dividing wirings and common wirings on the array substrates often cause short circuits due to particulate impurities or electrostatic discharge, which drastically affects quality of the display panels.

SUMMARY OF INVENTION

An object of the present application is to overcome a technical problem of short circuits between voltage-dividing wirings and common wirings of current display panels.

To achieve the above-mentioned object, the present application provides an array substrate and a display panel for alleviating the technical problem of the short circuits between the voltage-dividing wirings and the common wirings of the current display panels.

The present application provides an array substrate, comprising a base substrate; a first metal layer disposed on the base substrate; a first insulating layer disposed on the first metal layer; a second metal layer disposed on the first insulating layer; a second insulating layer disposed on the second metal layer; and a pixel electrode layer disposed on the second insulating layer and comprising a plurality of pixel electrodes; wherein the array substrate further comprises a plurality of common wirings and a plurality of voltage-dividing wirings, the common wirings are formed by patterning the first metal layer or the second metal layer, the voltage-dividing wirings are formed by patterning the first metal layer or the second metal layer, and an orthographic projection of the common wirings on the base substrate does not overlap with an orthographic projection of the voltage-dividing wirings on the base substrate.

In the array substrate of the present application, the common wirings and the voltage-dividing wirings are arranged on a same layer.

In the array substrate of the present application, the common wirings and the voltage-dividing wirings are arranged in parallel.

In the array substrate of the present application, a projection of each of the common wirings on the base substrate is an area including a square.

In the array substrate of the present application, a projection of each of the voltage-dividing wirings on the base substrate is an area including a square.

In the array substrate of the present application, each of the common wirings comprises a first portion and a second portion each extending in a first direction and arranged in a second direction, and a plurality of third portions extending in the second direction and electrically connected to the first portion and the second portion.

In the array substrate of the present application, each of the voltage-dividing wirings comprises a fourth portion and a fifth portion each extending in the first direction and arranged in the second direction, and a plurality of six portions extending in the second direction and electrically connected to the fourth portion and the fifth portion.

In the array substrate of the present application, the first metal layer comprises a plurality of scan lines extending in a first direction, and the second metal layer comprises a plurality of data lines extending in a second direction; and the common wirings and the voltage-dividing wirings both extend in the first direction and are disposed on the first metal layer.

In the array substrate of the present application, an orthographic projection of the common wirings on the base substrate does not overlap with an orthographic projection of the scan lines on the base substrate.

In the array substrate of the present application, an orthographic projection of the voltage-dividing wirings on the base substrate does not overlap with an orthographic projection of the scan lines on the base substrate.

In the array substrate of the present application, one of the common wirings and one of the voltage-dividing wirings are arranged between adjacent ones of the scan lines In the array substrate of the present application, the pixel electrodes are further arranged between the adjacent ones of the scan lines, each of the pixel electrodes comprises a main pixel electrode and an auxiliary pixel electrode, and each of the voltage-dividing wirings is electrically connected to a corresponding one of the main pixel electrodes.

In the array substrate of the present application, an orthographic projection of each of the main pixel electrodes on the base substrate overlaps at least partially with an orthographic projection of each of the voltage-dividing wirings on the base substrate.

In the array substrate of the present application, an orthographic projection of each of the auxiliary pixel electrodes on the base substrate overlaps at least partially with an orthographic projection of each of the common wirings on the base substrate.

In the array substrate of the present application, the main pixel electrodes and the auxiliary pixel electrodes disposed on opposite sides of a same one of the scan lines in the second direction are electrically connected to a same one of the data lines via a switching element.

In the array substrate of the present application, each of square areas formed by intersecting the scan lines and the data lines is configured with one of the main pixel electrodes and one of the auxiliary pixel electrodes.

In the array substrate of the present application, the main pixel electrodes and the auxiliary pixel electrodes are pixel electrodes with radial spaced branches.

The present application further provides an array substrate, comprising a base substrate; a first metal layer disposed on the base substrate, wherein the first metal layer comprises a plurality of scan lines extending in a first direction, a plurality of common wirings extending in the first direction, and a plurality of voltage-dividing wirings extending in the first direction; a first insulating layer disposed on the first metal layer; a second metal layer disposed on the first insulating layer and comprising a plurality of data lines extending in a second direction; a second insulating layer disposed on the second metal layer; and a pixel electrode layer disposed on the second insulating layer and comprising a plurality of pixel electrodes; wherein an orthographic projection of the common wirings on the base substrate does not overlap with an orthographic projection of the voltage-dividing wirings on the base substrate, an orthographic projection of the common wirings on the base substrate does not overlap with an orthographic projection of the scan lines on the base substrate, and the orthographic projection of the voltage-dividing wirings on the base substrate does not overlap with the orthographic projection of the scan lines on the base substrate.

The present application further provides a display panel, comprising an array substrate, an opposing substrate that is disposed opposite to the array substrate, and a liquid crystal disposed between the array substrate and the opposing substrate; the array substrate comprises a base substrate; a first metal layer disposed on the base substrate; a first insulating layer disposed on the first metal layer; a second metal layer disposed on the first insulating layer; a second insulating layer disposed on the second metal layer; and a pixel electrode layer disposed on the second insulating layer and comprising a plurality of pixel electrodes; wherein the array substrate further comprises a plurality of common wirings and a plurality of voltage-dividing wirings, the common wirings are formed by patterning the first metal layer or the second metal layer, the voltage-dividing wirings are formed by patterning the first metal layer or the second metal layer, and an orthographic projection of the common wirings on the base substrate does not overlap with an orthographic projection of the voltage-dividing wirings on the base substrate.

In the display panel of the present application, the common wirings and the voltage-dividing wirings are arranged in parallel.

The present application has advantageous effects as follows: the present application provides an array substrate and a display panel. The array substrate comprises a base substrate, a first metal layer disposed on the base substrate, a first insulating layer disposed on the first metal layer, a second metal layer disposed on the first insulating layer, a second insulating layer disposed on the second metal layer, and a pixel electrode layer disposed on the second insulating layer. The array substrate further comprises a plurality of common wirings and a plurality of voltage-dividing wirings, the common wirings are formed by patterning the first metal layer or the second metal layer, and the voltage-dividing wirings are formed by patterning the first metal layer or the second metal layer. An orthographic projection of the common wirings on the base substrate does not overlap with an orthographic projection of the voltage-dividing wirings on the base substrate. By arranging the orthographic projection of the common wirings on the base substrate to not overlap with the orthographic projection of the voltage-dividing wirings on the base substrate, the common wirings and the voltage-dividing wirings are staggered from each other in a direction of thickness of the array substrate, thereby lowering the risk of short-circuit issues between the common wirings and the voltage-dividing wirings and improving the quality of the display panel.

BRIEF DESCRIPTION OF DRAWINGS

To describe the technical solutions in the embodiments of the present invention, the following briefly introduces the accompanying drawings for describing the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

Figure 1:
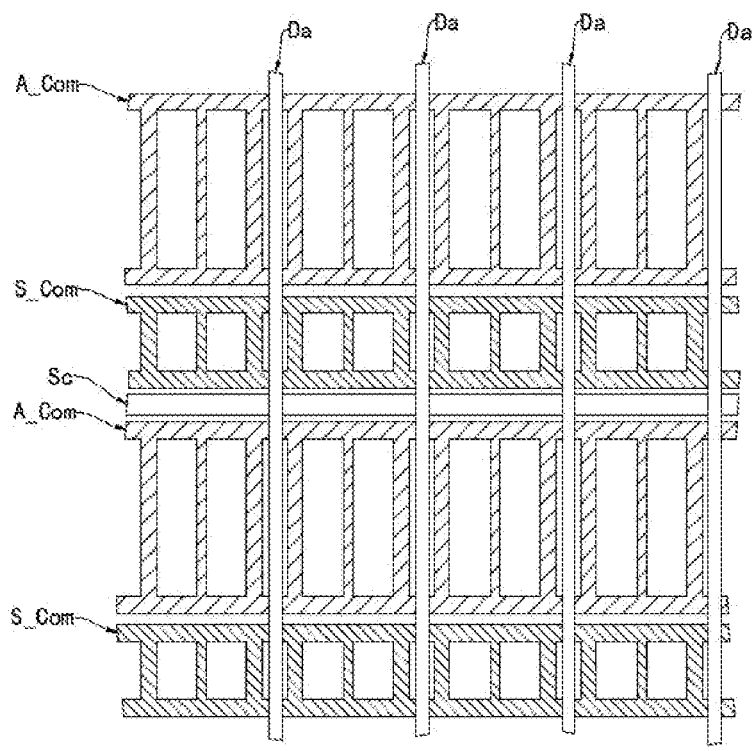
FIG. 1 is a diagram illustrating a first partial perspective view of an array substrate provided by an embodiment of the present application.

The following embodiments are described with reference to the attached drawings to exemplify particular embodiments in which the present application may be implemented. Some terms used in the present application, e.g., "left", "right", "inside", "outside", "side", etc., should be referenced with the directions shown in the drawings. Accordingly, these directional terms are intended to help illustrate and understand the present application, and are not intended to limit the scope of the present application.

An embodiment of the present application provides an array substrate and a display panel. The array substrate includes a base substrate, a first metal layer disposed on the base substrate, a first insulating layer disposed on the first metal layer, a second metal layer disposed on the first insulating layer, a second insulating layer disposed on the second metal layer, and a pixel electrode layer disposed on the second insulating layer. The array substrate further includes a plurality of common wirings and a plurality of voltage-dividing wirings, the common wirings are formed by patterning the first metal layer or the second metal layer, the voltage-dividing wirings are formed by patterning the first metal layer or the second metal layer, and an orthographic projection of the common wirings on the base substrate does not overlap with an orthographic projection of the voltage-dividing wirings on the base substrate. By arranging the orthographic projection of the common wirings on base substrate to not overlap with the orthographic projection of the voltage-dividing wirings on the base substrate, the common wirings and the voltage-dividing wirings do not align with each other in a direction of a thickness of the array substrate, thereby lowering a risk of short-circuit issues between the common wirings and the voltage-dividing wirings.

Structural features of the array substrate provided in the present application will be described with reference to specific embodiments.

Figure 2:
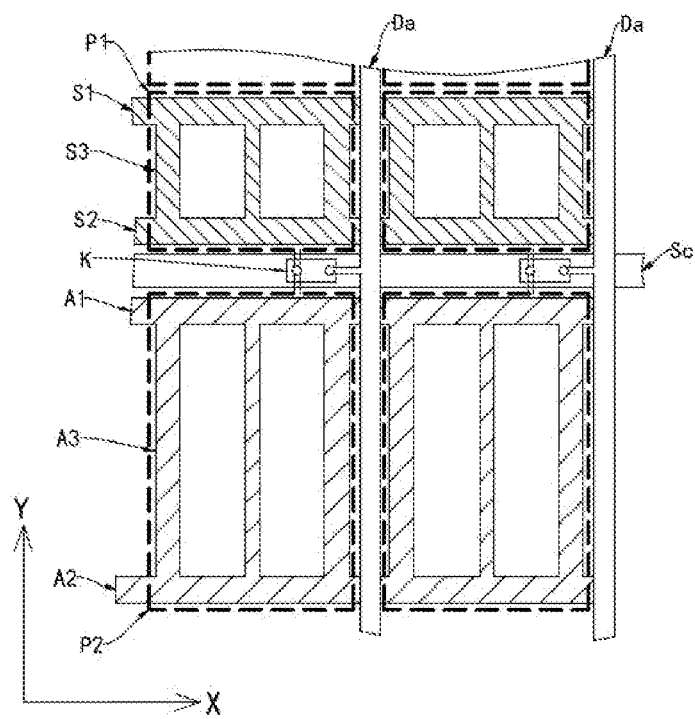
FIG. 2 is a diagram illustrating a second partial perspective view of an array substrate provided by an embodiment of the present application.
Figure 3:
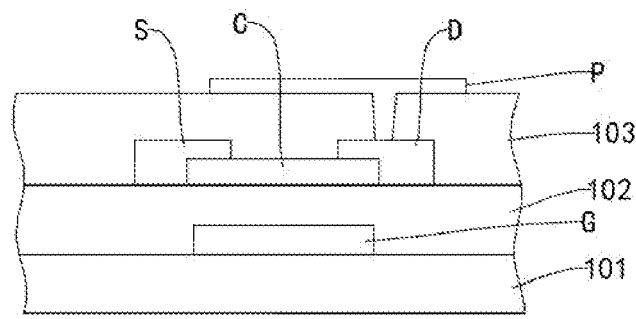
FIG. 3 is a schematic structural diagram illustrating a first kind cross-sectional view of the array substrate shown in FIG. 2 in a switching-element area.
Figure 4:
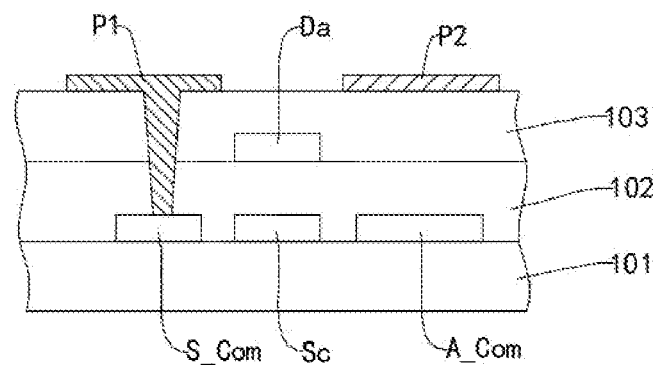
FIG. 4 is a schematic structural diagram illustrating a first kind cross-sectional view of the array substrate shown in FIG. 2 in a voltage-dividing wiring area.

One embodiment is shown as FIG. 1 to FIG. 4, wherein FIG. 1 is a diagram illustrating a first partial perspective view of an array substrate provided by an embodiment of the present application, FIG. 2 is a diagram illustrating a second partial perspective view of an array substrate provided by an embodiment of the present application, FIG. 3 is a schematic structural diagram illustrating a first kind cross-sectional view of the array substrate shown in FIG. 2 in the switching-element area, and FIG. 4 is a schematic structural diagram illustrating a first kind cross-sectional view of the array substrate shown in FIG. 2 in the voltage-dividing wiring area.

The array substrate includes: a base substrate 101, a first metal layer disposed on the base substrate, a first insulating layer 102 disposed on the first metal layer, a second metal layer disposed on the first insulating layer 102, a second insulating layer 103 disposed on the second metal layer, and a pixel electrode layer disposed on the second insulating layer 103. The first metal layer includes scan lines Sc, voltage-dividing wirings S_Com, and common wirings A_Com. The second metal layer includes data lines Da. The pixel electrode layer includes pixel electrodes P, and each pixel electrode includes a main pixel electrode P1 and an auxiliary pixel electrode P2.

Alternatively, the base substrate 101 can be a rigid substrate such as a glass substrate, or a flexible substrate such as a polyamide substrate. A buffer layer can be provided further between the base substrate 101 and the first metal layer to buffer stress mismatch between the base substrate 101 and the first metal layer. The buffer layer may include a combined film layer consisting of multiple organic and inorganic material layers.

The first insulating layer 102 and the second insulating layer 103 are made of insulating materials. Alternatively, the first insulating layer 102 and the second insulating layer 103 may be a silicon nitride layer or a silicon oxide layer formed by a chemical vapor deposition process.

Specifically, both the common wirings A_Com and the voltage-dividing wirings S_Com are formed by patterning the first metal layer, and an orthographic projection of the common wirings A_Com on the base substrate 101 does not overlap with an orthographic projection of the voltage-dividing wirings S_Com on the base substrate 101. That is, in the first metal layer, a wiring area of the common wirings A_Com and a wiring area of the voltage-dividing wirings S_Com are staggered from each other, thus preventing short-circuit issues from being encountered when the common wirings are overlapped with the voltage-dividing wirings, which improves reliability of an array substrate device.

Further, the common wirings A_Com and the voltage-dividing wirings S_Com are arranged in parallel, both the common wirings A_Com and the voltage-dividing wirings S_Com extend in a first direction X, and both the common wirings A_Com and the voltage-dividing wirings S_Com are arranged in a second direction Y. Alternatively, the first direction X and the second direction Y are two directions perpendicular to each other.

Further, a shape of an area enclosed by the orthographic projection of the common wirings A_Com on the base substrate 101 includes a square, and a shape of an area enclosed by the orthographic projection of the voltage-dividing wirings S_Com on the base substrate 101 also includes a square.

It should be noted that the common wirings A_Com serve to form a storage capacitor between the common wirings A_Com and the pixel electrodes P in order to preserve a magnitude of an electric field generated by the pixel electrode P. This provides a larger area for the common wirings A_Com with a square structure and the pixel electrode P to overlap with each other, which facilitates formation of a stable and uniform storage capacitor. A function of the voltage-dividing wirings S_Com is to pull down a voltage of the main pixel electrode P1. The larger an overlapping area between the voltage-dividing wirings S_Com with the square structure and the main pixel electrode P1 is, the stronger an electrical connection can be formed between the voltage-dividing wirings S_Com and the main pixel electrode P1, which facilitates the main pixel electrode P1 in generating a stable and uniform electric field intensity.

Further, each of the common wirings A_Com includes: a first portion A1 and a second portion A2 extending in the first direction X and arranged in the second direction Y, and a plurality of third portions A3 extending in the second direction Y and electrically connected to the first portion A1 and the second portion A2. It is possible to arrange a larger overlapping area between the common wiring A_Com with above-mentioned structure and the pixel electrode P. This benefits in forming a stable and uniform storage capacitor between the pixel electrode P and the common wiring A_Com.

Each of the voltage-dividing wirings S_Com includes: a fourth portion S1 and a fifth portion S2 each extending in the first direction X and arranged in the second direction Y, and a plurality of sixth portions S3 extending in the second direction Y and electrically connected to the fourth portion S1 and the fifth portion S2. The larger an overlapping area between the voltage-dividing wirings S_Com with above-mentioned structure and the main pixel electrode P1 is, the stronger the electrical connection can be formed between the S_Com and the main pixel electrode P1, which facilitates the main pixel electrode P1 in generating the stable and uniform electric field intensity.

Each of the scan lines Sc extends in the first direction X, and the scan lines Sc are arranged in the second direction Y. Each of the data lines Da extends in the second direction Y, and the data lines Da are arranged in the first direction X. Each square area formed by intersecting the scan lines Sc with the data lines Da is corresponding to a pixel area, and each of the pixel areas is arranged with one main pixel electrode P1 and one auxiliary pixel electrode P2. The main pixel electrode P1 and the auxiliary pixel electrode P2 may be pixel electrodes with radial spaced branches.

Alternatively, both the main pixel electrode P1 and the auxiliary pixel electrode P2 may be indium tin oxide electrodes.

Further, the voltage-dividing wirings S_Com, the common wirings A_Com, and the scan line Sc are all positioned in the first metal layer, and the orthographic projection of the common wirings A_Com on the base substrate 101 does not overlap with an orthographic projection of the scan line Sc on the base substrate 101. The orthographic projection of the voltage-dividing wirings S_Com on the base substrate 101 does not overlap with the orthographic projection of the scan line Sc on the base substrate 101.

There are one common wiring A_Com and one voltage-dividing wiring S_Com arranged between two adjacent scan lines Sc. An orthographic projection of the main pixel electrode P1 on the base substrate 101 overlaps at least partially with the orthographic projection of the voltage-dividing wiring S_Com on the base substrate 101, and an orthographic projection of the auxiliary pixel electrode P2 on the base substrate 101 at least partially overlaps with the orthographic projection of the common wiring A_Com on the base substrate 101.

Further, the voltage-dividing wiring S_Com is electrically connected to the main pixel electrode P1. The voltage-dividing wiring S_Com is arranged to pull down the voltage of the main pixel electrode P1, making an electric field intensity generated by the main pixel electrode P1 different from an electric field intensity generated by the auxiliary pixel electrode P2. When the array substrate is applied in a liquid crystal display (LCD) panel, design of this embodiment may make liquid crystal molecules in a same pixel area generate different deflection angles, thus improving viewing angles of the LCD panel.

Further, both the main pixel electrodes P1 and the auxiliary pixel electrode P2 disposed in the second direction Y on opposite sides of a same scan line Sc are electrically connected to a same data line Da via a switch element K. The main pixel electrode P1 and the auxiliary pixel electrode P2 receive data signals transmitted from the data line Da to generate specific electric field intensities, wherein under operation of the voltage-dividing wirings S_Com, the main pixel electrode P1 generates an electric field intensity different from that of the auxiliary pixel electrode P2.

Alternatively, the switch element K may be a thin film transistor device. Specifically, the switch element K includes a gate G, a channel C, a source S, and a drain D. The gate G is disposed on the first metal layer, the source S and the drain D are disposed on the second metal layer, the channel C is disposed on the first insulating layer 102, and the source S and the drain D are correspondingly connected to two opposite ends of the channel C, respectively. The gate G is electrically connected to the scan line Sc, the source S is electrically connected to the data line Da, and the drain D is electrically connected to the pixel electrode P. Specifically, the drain D is electrically connected to both the main pixel electrode P1 and the auxiliary pixel electrode P2.

Figure 5:
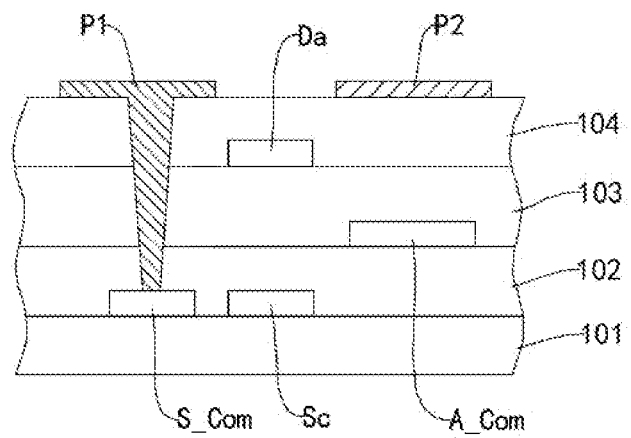
FIG. 5 is a schematic structural diagram illustrating a second kind cross-sectional view of the array substrate shown in FIG. 2 in the voltage-dividing wiring area.

In one embodiment, please refer to FIG. 1, FIG. 2, and FIG. 5. FIG. 5 is a schematic structural diagram illustrating a second kind cross-sectional view of the array substrate shown in FIG. 2 in the voltage-dividing wiring area. The array substrate shown in FIG. 5 has some structural features identical or similar to those of the array substrates shown in FIG. 3 and FIG. 4. The structural features of the array substrate shown in FIG. 5 is illustrated as follows. For some parts not described in details, please refer to contents recited in above-mentioned embodiments.

In this embodiment, the array substrate includes a base substrate 101, a first metal layer disposed on the base substrate 101, a first insulating layer 102 disposed on the first metal layer, a second metal layer disposed on the first insulating layer 102, a second insulating layer 103 disposed on the second metal layer, a third metal layer disposed on the second insulating layer 103, a third insulating layer 104 disposed on the third metal layer, and a pixel electrode layer disposed on the third insulating layer 104.

The first metal layer includes scan lines Sc and voltage-dividing wirings S Coin. The second metal layer includes common wirings A Coin, and the third metal layer includes data lines Da. The pixel electrode layer includes pixel electrodes P, and each of the pixel electrodes P includes a main pixel electrode P1 and an auxiliary pixel electrode P2.

Further, an orthographic projection of the common wirings A_Com on the base substrate 101 does not overlap with an orthographic projection of the voltage-dividing wirings S_Com on the base substrate 101. That is, a wiring area of the common wirings A_Com and a wiring area of the voltage-dividing wirings S_Com are staggered from each other, thus preventing short-circuit issues from being encountered when the common wirings overlap with the voltage-dividing wirings, thereby improving reliability of an array substrate device.

Further, the common wirings A_Com and the voltage-dividing wirings S_Com are arranged in parallel, and both the common wirings A_Com and the voltage-dividing wirings S_Com extend in a first direction X, and both the common wirings A_Com and the voltage-dividing wirings S_Com area are arranged in a second direction Y. Alternatively, the first direction X and the second direction Y are directions perpendicular to each other.

Further, a shape of an area enclosed by the orthographic projection of each of the common wirings A_Com on the base substrate 101 includes a square, and a shape of an area enclosed by the orthographic projection of each of the voltage-dividing wirings S_Com on the base substrate 101 also includes a square.

Each of the common wirings A_Com includes a first portion A1 and a second portion A2 extending in the first direction X and arranged in the second direction Y, and a plurality of third portions A3 extending in the second direction Y and electrically connected to the first portion A1 and the second portion A2.

Each of the voltage-dividing wirings S_Com includes: a fourth portion S1 and a fifth portion S2 extending in the first direction X and arranged in the second direction, and a plurality of sixth portions S3 extending in the second direction Y and electrically connected to the fourth portion S1 and the fifth portion S2.

Each of the scan lines Sc extends in the first direction X, and the scan lines Sc are arranged in the second direction Y. Each of the data lines Da extends in the second direction Y, and the data lines Da are arranged in the first direction X.

The orthographic projection of the common wirings A_Com on the base substrate 101 does not overlap with an orthographic projection of the scan line Sc on the base substrate 101. The orthographic projection of the voltage-dividing wirings S_Com on the base substrate 101 does not overlap with the orthographic projection of the scan line Sc on the base substrate 101.

The voltage-dividing wiring S_Com is electrically connected to the main pixel electrode P1, and the voltage-dividing wiring S_Com is arranged to pull down a voltage of the main pixel electrode P1 in order to make an electric field intensity generated by the main pixel electrode P1 different from an electric field intensity generated by the auxiliary pixel electrode P2.

Further, both the main pixel electrode P1 and the auxiliary pixel electrode P2 disposed in the second direction Y on opposite sides of a same the scan line Sc are electrically connected to a same data line Da via a switch element K.

Figure 6:
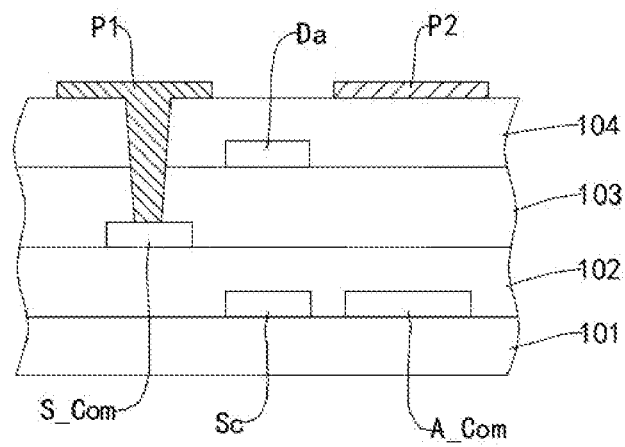
FIG. 6 is a schematic structural diagram illustrating a third kind cross-sectional view of the array substrate shown in FIG. 2 in the voltage-dividing wiring area.

In one embodiment, please refer to FIG. 1, FIG. 2, and FIG. 6. FIG. 6 is a schematic structural diagram illustrating a third kind cross-sectional view of the array substrate shown in FIG. 2 in the voltage-dividing wiring area. The array substrate shown in FIG. 6 has some structural features identical or similar to those of the array substrates shown in FIG. 3 and FIG. 4. The structural features of the array substrate shown in FIG. 6 are illustrated as follows. For some parts not described in details, please refer to the contents recited in the above-mentioned embodiments.

In this embodiment, the array substrate includes: a base substrate 101, a first metal layer disposed on the base substrate 101, a first insulating layer 102 disposed on the first metal layer, a second metal layer disposed on the first insulating layer 102, a second insulating layer 103 disposed on the second metal layer, a third metal layer disposed on the second insulating layer 103, a third insulating layer 104 disposed on the third metal layer, and a pixel electrode layer disposed on the third insulating layer 104.

The first metal layer includes scan lines Sc and common wirings A_Com. The second metal layer includes voltage-dividing wirings S_Com, and the third metal layer includes data lines Da. The pixel electrode layer includes pixel electrodes P, and each of the pixel electrodes P includes a main pixel electrode P1 and an auxiliary pixel electrode P2.

Further, an orthographic projection of the common wirings A_Com on the base substrate 101 does not overlap with an orthographic projection of the voltage-dividing wirings S_Com on the base substrate 101, thus preventing short-circuit issues from being encountered when the common wirings and the voltage-dividing wirings are overlapped, which improves reliability of an array substrate device.

Further, the common wirings A_Com and the voltage-dividing wirings S_Com are arranged in parallel, both the common wirings A_Com and the voltage-dividing wirings S_Com extend in a first direction X, and both the common wirings A_Com and the voltage-dividing wirings S_Com are arranged in a second direction Y.

Further, a shape of an area enclosed by the orthographic projection of the common wirings A_Com on the base substrate 101 includes a square, and a shape of an area enclosed by the orthographic projection of the voltage-dividing wirings S_Com on the base substrate 101 also includes a square.

Each of the common wirings A_Com includes: a first portion A1 and a second portion A2 extending in the first direction X and arranged in the second direction Y, and a plurality of third portions A3 extending in the second direction Y and electrically connected to the first portion A1 and the second portion A2.

Each of the voltage-dividing wirings S_Com includes: a fourth portion S1 and a fifth portion S2 extending in the first direction X and arranged in the second direction Y, and a plurality of sixth portions S3 extending in the second direction Y and electrically connected to the fourth portion S1 and the fifth portion S2.

Each of the scan lines Sc extends in the first direction X, and the scan lines Sc are arranged in the second direction Y. Each of the data lines Da extends in the second direction Y, and the data lines Da are arranged in the first direction X.

The orthographic projection of the common wirings A_Com on the base substrate 101 does not overlap with an orthographic projection of the scan line Sc on the base substrate 101. The orthographic projection of the voltage-dividing wirings S_Com on the base substrate 101 does not overlap with the orthographic projection of the scan line Sc on the base substrate 101.

The voltage-dividing wiring S_Com is electrically connected to the main pixel electrode P1, and the voltage-dividing wiring S_Com is arranged to pull down a voltage of the main pixel electrode P1, making an electric field intensity generated by the main pixel electrode P1 different from an electric field intensity generated by the auxiliary pixel electrode P2.

Further, the main pixel electrode P1 and the auxiliary pixel electrode P2 disposed in the second direction Y on two opposite sides of a same the scan line Sc are electrically connected to a same data line Da via a switch element K.

Figure 7:
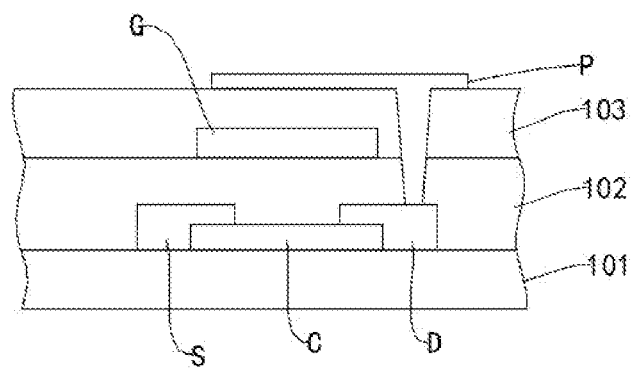
FIG. 7 is a schematic structural diagram illustrating a second kind cross-sectional view of the array substrate shown in FIG. 2 in the switching-element area.
Figure 8:
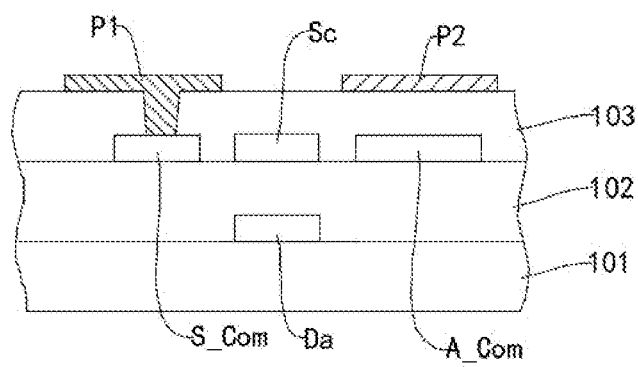
FIG. 8 is a schematic structural diagram illustrating a fourth kind cross-sectional view of the array substrate shown in FIG. 2 in the voltage-dividing wiring area.

In one embodiment, please refer to FIG. 1, FIG. 2, FIG. 7, and FIG. 8. FIG. 7 is a schematic structural diagram illustrating diagram illustrating a second kind cross-sectional view of the array substrate shown in FIG. 2 in the switching-element area, and FIG. 8 is a schematic structural diagram illustrating a fourth kind cross-sectional view of the array substrate shown in FIG. 2 in the voltage-dividing wiring area.

The array substrate includes: a base substrate 101, a first metal layer disposed on the base substrate 101, a first insulating layer 102 disposed on the first metal layer, a second metal layer disposed on the first insulating layer 102, a second insulating layer 103 disposed on the second metal layer, and a pixel electrode layer disposed on the second insulating layer 103.

The first metal layer includes data lines Da. The second metal layer includes scan lines Sc, voltage-dividing wirings S_Com, and common wirings A_Com. The pixel electrode layer includes pixel electrodes P, and each of the pixel electrode P includes a main pixel electrode P1 and an auxiliary pixel electrode P2.

Both the common wirings A_Com and the voltage-dividing wirings S_Com are positioned on the second metal layer, and an orthographic projection of the common wirings A_Com on the base substrate 101 does not overlap with an orthographic projection of the voltage-dividing wirings S_Com on the base substrate 101, thus preventing short-circuit issues from being encountered when the common wirings are overlapped with the voltage-dividing wirings, which improves reliability of an array substrate device.

Further, the common wirings A_Com and the voltage-dividing wirings S_Com are arranged in parallel, and both the common wirings A_Com and the voltage-dividing wirings S_Com extend in the first direction X, and both the plurality of common wirings A_Com and the plurality of voltage-dividing wirings S_Com are arranged in the second direction Y.

Further, a shape of an area enclosed by the orthographic projection of each of the common wirings A_Com on the base substrate 101 includes a square, and a shape of an area enclosed by the orthographic projection of each of the voltage-dividing wirings S_Com on the base substrate 101 also includes a square. It should be noted that the common wirings A_Com with a square structure and the pixel electrode P have more overlapping space, which can facilitate formation of a stable and uniform storage capacitor. The larger an overlapping area between the voltage-dividing wirings S_Com with the square structure and the main pixel electrode P1 is, the stronger an electrical connection can be formed between the S Coin and the main pixel electrode P1, which facilitates the main pixel electrode P1 in generating a stable and uniform electric field intensity.

Further, each of the common wirings A_Com includes: a first portion A1 and a second portion A2 extending in a first direction X and arranged in a second direction Y, and a plurality of third portions A3 extending in the second direction Y and electrically connected to the first portion A1 and the second portion A2.

Each of the voltage-dividing wirings S_Com includes: a fourth portion S1 and a fifth portion S2 each extending in the first direction X and arranged in the second direction Y, and a plurality of sixth portions S3 extending in the second direction Y and electrically connected to the fourth portion S1 and the fifth portion S2.

Each of the scan lines Sc extends in the first direction X, and the scan lines Sc are arranged in the second direction Y. Each of the data lines Da extends in the second direction Y, and the data lines Da are arranged in the first direction X. Each square area enclosed by intersecting the scan lines Sc with the data lines Da is corresponding to one pixel area, and each of the pixel area is arranged with one main pixel electrode P1 and one auxiliary pixel electrode P2.

Further, the voltage-dividing wirings S_Com, the common wirings A_Com, and the scan lines Sc are all positioned in the second metal layer, and the orthographic projection of the common wirings A_Com on the base substrate 101 does not overlap with an orthographic projection of the scan line Sc on the base substrate 101. The orthographic projection of the voltage-dividing wirings S_Com on the base substrate 101 does not overlap with the orthographic projection of the scan line Sc on the base substrate 101.

One common wiring A_Com and one voltage-dividing wiring S_Com are arranged between two adjacent scan lines Sc, wherein an orthographic projection of the main pixel electrode P1 on the base substrate 101 overlaps at least partially with the orthographic projection of the voltage-dividing wiring S_Com on the base substrate 101, and an orthographic projection of the auxiliary pixel electrode P2 on the base substrate 101 overlaps at least partially with the orthographic projection of the common wiring A_Com on the base substrate 101.

Further, the voltage-dividing wiring S_Com is electrically connected to the main pixel electrode P1, and the voltage-dividing wiring S_Com is arranged to pull down a voltage of the main pixel electrode P1, making an electric field intensity generated by the main pixel electrode P1 different from an electric field intensity generated by the auxiliary pixel electrode P2.

Further, the main pixel electrode P1 and the auxiliary pixel electrode P2 disposed in the second direction Y on opposite sides of a same scan line Sc are electrically connected to a same data line Da via a switch element K.

The switch element K may be a thin film transistor device. Specifically, the switch element K includes a channel C, a source S, a drain D, and a gate G. The source S and the drain D are disposed on the first metal layer, the gate G is disposed on the second metal layer, the channel C is disposed on the base substrate 101, and the source S and the drain D are correspondingly connected to two opposite ends of the channel C, respectively. The gate G is electrically connected to the scan line Sc, the source S is electrically connected to the data line Da, and the drain D is electrically connected to the pixel electrode P.

Accordingly, the array substrate provided in the embodiments of the present application includes a base substrate, a first metal layer disposed on the base substrate, a first insulating layer disposed on the first metal layer, a second metal layer disposed on the first insulating layer, a second insulating layer disposed on the second metal layer, and a pixel electrode layer disposed on the second insulating layer. The array substrate further includes a plurality of common wirings and a plurality of voltage-dividing wirings, the common wirings are formed in the first metal layer or the second metal layer, and the voltage-dividing wirings are formed in the first metal layer or the second metal layer. An orthographic projection of the common wirings on the base substrate does not overlap with an orthographic projection of the voltage-dividing wirings on the base substrate. Since the embodiments of the present application arrange the orthographic projection of the common wirings on base substrate to not overlap with the orthographic projection of the voltage-dividing wirings on the base substrate, the common wirings and the voltage-dividing wirings are staggered from each other in a direction of a thickness of the array substrate, thereby lowering a risk of short-circuit issues between the common wirings and the voltage-dividing wirings.

Figure 9:
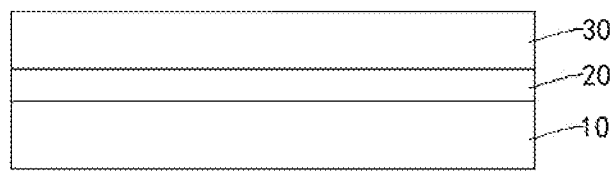
FIG. 9 is a schematic structural diagram of a display panel provided by an embodiment of the present application.

An embodiment of the present application further provides a display panel. Please refer to FIG. 9, the display panel includes an array substrate 10, an opposing substrate 30 disposed opposite to the array substrate 10, and liquid crystals 20 disposed between the array substrate 10 and the opposing substrate 30, wherein the array substrate 10 may be any array substrate provided in the above-mentioned embodiment.

An embodiment of the present application further provides a display device that includes the display panel. The display device may be a device with display functions, such as a display for a computer, a television, a notebook, a navigator, etc.

It should be noted that although the present application is disclosed as specific embodiments, the above-mentioned embodiments are not used to limit the scope of the present application. One skilled in the art can make various changes without departing from the spirit and scope of the present application. Hence, the scope of the present application is subject to the scope defined by the claims.

What is claimed is:
1. An array substrate, comprising:
a base substrate;
a first metal layer disposed on the base substrate;
a first insulating layer disposed on the first metal layer;
a second metal layer disposed on the first insulating layer;
a second insulating layer disposed on the second metal layer; and
a pixel electrode layer disposed on the second insulating layer and comprising a plurality of pixel electrodes;
wherein the array substrate further comprises a plurality of common wirings and a plurality of voltage-dividing wirings, the common wirings are formed by patterning the first metal layer or the second metal layer, the voltage-dividing wirings are formed by patterning the first metal layer or the second metal layer, and an orthographic projection of the common wirings on the base substrate does not overlap with an orthographic projection of the voltage-dividing wirings on the base substrate;
wherein each of the common wirings has a plurality of first closed hollow spaces defined through the common wiring, arranged in a row, and corresponding to some of the pixel electrodes, and each of the voltage-dividing wirings has a plurality of second closed hollow spaces defined through the voltage-dividing wiring, arranged in a row and corresponding to some of the pixel electrodes.

2. The array substrate of claim 1, wherein the common wirings and the voltage-dividing wirings are arranged on a same layer.

3. The array substrate of claim 1, wherein the common wirings and the voltage-dividing wirings are arranged in parallel.

4. The array substrate of claim 1, wherein a projection of each of the common wirings on the base substrate is an area including a square.

5. The array substrate of claim 1, wherein a projection of each of the voltage-dividing wirings on the base substrate is an area including a square.

6. The array substrate of claim 1, wherein each of the common wirings comprises a first portion and a second portion each extending in a first direction and arranged in a second direction, and a plurality of third portions extending in the second direction and electrically connected to the first portion and the second portion.

7. The array substrate of claim 6, wherein each of the voltage-dividing wirings comprises a fourth portion and a fifth portion each extending in the first direction and arranged in the second direction, and a plurality of sixth portions extending in the second direction and electrically connected to the fourth portion and the fifth portion.

8. The array substrate of claim 1, wherein the first metal layer comprises a plurality of scan lines extending in a first direction, and the second metal layer comprises a plurality of data lines extending in a second direction; and
the common wirings and the voltage-dividing wirings both extend in the first direction and are disposed on the first metal layer.

9. The array substrate of claim 8, wherein the orthographic projection of the common wirings on the base substrate does not overlap with an orthographic projection of the scan lines on the base substrate.

10. The array substrate of claim 8, wherein the orthographic projection of the voltage-dividing wirings on the base substrate does not overlap with an orthographic projection of the scan lines on the base substrate.

11. The array substrate of claim 8, wherein one of the common wirings and one of the voltage-dividing wirings are arranged between adjacent ones of the scan lines.

12. The array substrate of claim 11, wherein the pixel electrodes are further arranged between the adjacent ones of the scan lines, each of the pixel electrodes comprises a main pixel electrode and an auxiliary pixel electrode, and each of the voltage-dividing wirings is electrically connected to a corresponding one of the main pixel electrodes.

13. The array substrate of claim 12, wherein an orthographic projection of each of the main pixel electrodes on the base substrate overlaps at least partially with the orthographic projection of each of the voltage-dividing wirings on the base substrate.

14. The array substrate of claim 12, wherein an orthographic projection of each of the auxiliary pixel electrodes on the base substrate overlaps at least partially with the orthographic projection of each of the common wirings on the base substrate.

15. The array substrate of claim 12, wherein the main pixel electrodes and the auxiliary pixel electrodes disposed on opposite sides of a same one of the scan lines in the second direction are electrically connected to a same one of the data lines via a switching element.

16. The array substrate of claim 12, wherein each of square areas formed by intersecting the scan lines and the data lines is configured with one of the main pixel electrodes and one of the auxiliary pixel electrodes.

17. The array substrate of claim 16, wherein the main pixel electrodes and the auxiliary pixel electrodes are pixel electrodes with radial spaced branches.

18. An array substrate, comprising:
a base substrate;
a first metal layer disposed on the base substrate, wherein the first metal layer comprises a plurality of scan lines extending in a first direction, a plurality of common wirings extending in the first direction, and a plurality of voltage-dividing wirings extending in the first direction;
a first insulating layer disposed on the first metal layer;
a second metal layer disposed on the first insulating layer and comprising a plurality of data lines extending in a second direction;
a second insulating layer disposed on the second metal layer; and
a pixel electrode layer disposed on the second insulating layer and comprising a plurality of pixel electrodes;
wherein an orthographic projection of the common wirings on the base substrate does not overlap with an orthographic projection of the voltage-dividing wirings on the base substrate, an orthographic projection of the common wirings on the base substrate does not overlap with an orthographic projection of the scan lines on the base substrate, and the orthographic projection of the voltage-dividing wirings on the base substrate does not overlap with the orthographic projection of the scan lines on the base substrate;
wherein each of the common wirings has a plurality of first closed hollow spaces defined through the common wiring, arranged in a row, and corresponding to some of the pixel electrodes, and each of the voltage-dividing wirings has a plurality of second closed hollow spaces defined through the voltage-dividing wiring, arranged in a row and corresponding to some of the pixel electrodes.

19. A display panel, comprising an array substrate, an opposing substrate that is disposed opposite to the array substrate, and a liquid crystal disposed between the array substrate and the opposing substrate; the array substrate comprises:
a base substrate;
a first metal layer disposed on the base substrate;
a first insulating layer disposed on the first metal layer;
a second metal layer disposed on the first insulating layer;
a second insulating layer disposed on the second metal layer; and
a pixel electrode layer disposed on the second insulating layer and comprising a plurality of pixel electrodes;
wherein the array substrate further comprises a plurality of common wirings and a plurality of voltage-dividing wirings, the common wirings are formed by patterning the first metal layer or the second metal layer, the voltage-dividing wirings are formed by patterning the first metal layer or the second metal layer, and an orthographic projection of the common wirings on the base substrate does not overlap with an orthographic projection of the voltage-dividing wirings on the base substrate;
wherein each of the common wirings has a plurality of first closed hollow spaces defined through the common wiring, arranged in a row, and corresponding to some of the pixel electrodes, and each of the voltage-dividing wirings has a plurality of second closed hollow spaces defined through the voltage-dividing wiring, arranged in a row and corresponding to some of the pixel electrodes.

20. The display panel of claim 19, wherein the common wirings and the voltage-dividing wirings are arranged in parallel.

* * * * *